(12) United States Patent
Xu

(10) Patent No.: US 7,737,554 B2
(45) Date of Patent: Jun. 15, 2010

(54) PITCH BY SPLITTING BOTTOM METALLIZATION LAYER

(75) Inventor: Jeffrey Junhao Xu, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 106 days.

(21) Appl. No.: 11/768,051

(22) Filed: Jun. 25, 2007

(65) Prior Publication Data

US 2008/0315348 A1    Dec. 25, 2008

(51) Int. Cl.
*H01L 23/48* (2006.01)
(52) U.S. Cl. ............... 257/750; 257/736; 257/E23.019; 257/758
(58) Field of Classification Search ................. 257/758, 257/773–776, 324, 750
See application file for complete search history.

(56) References Cited

U.S. PATENT DOCUMENTS

| | | | | |
|---|---|---|---|---|
| 6,239,025 | B1* | 5/2001 | Bease et al. | 438/637 |
| 7,006,370 | B1* | 2/2006 | Ramesh et al. | 365/63 |
| 2004/0140569 | A1* | 7/2004 | Meguro et al. | 257/776 |

* cited by examiner

*Primary Examiner*—Jerome Jackson, Jr.
*Assistant Examiner*—Dale Page
(74) *Attorney, Agent, or Firm*—Slater & Matsil, L.L.P.

(57) ABSTRACT

An integrated circuit structure includes a semiconductor substrate; a first bottom metallization (M1) layer over the semiconductor substrate; a second M1 layer over the first M1 layer, wherein metal lines in the first and the second M1 layer have widths of greater than about a minimum feature size; and vias connecting the first and the second M1 layers.

20 Claims, 16 Drawing Sheets

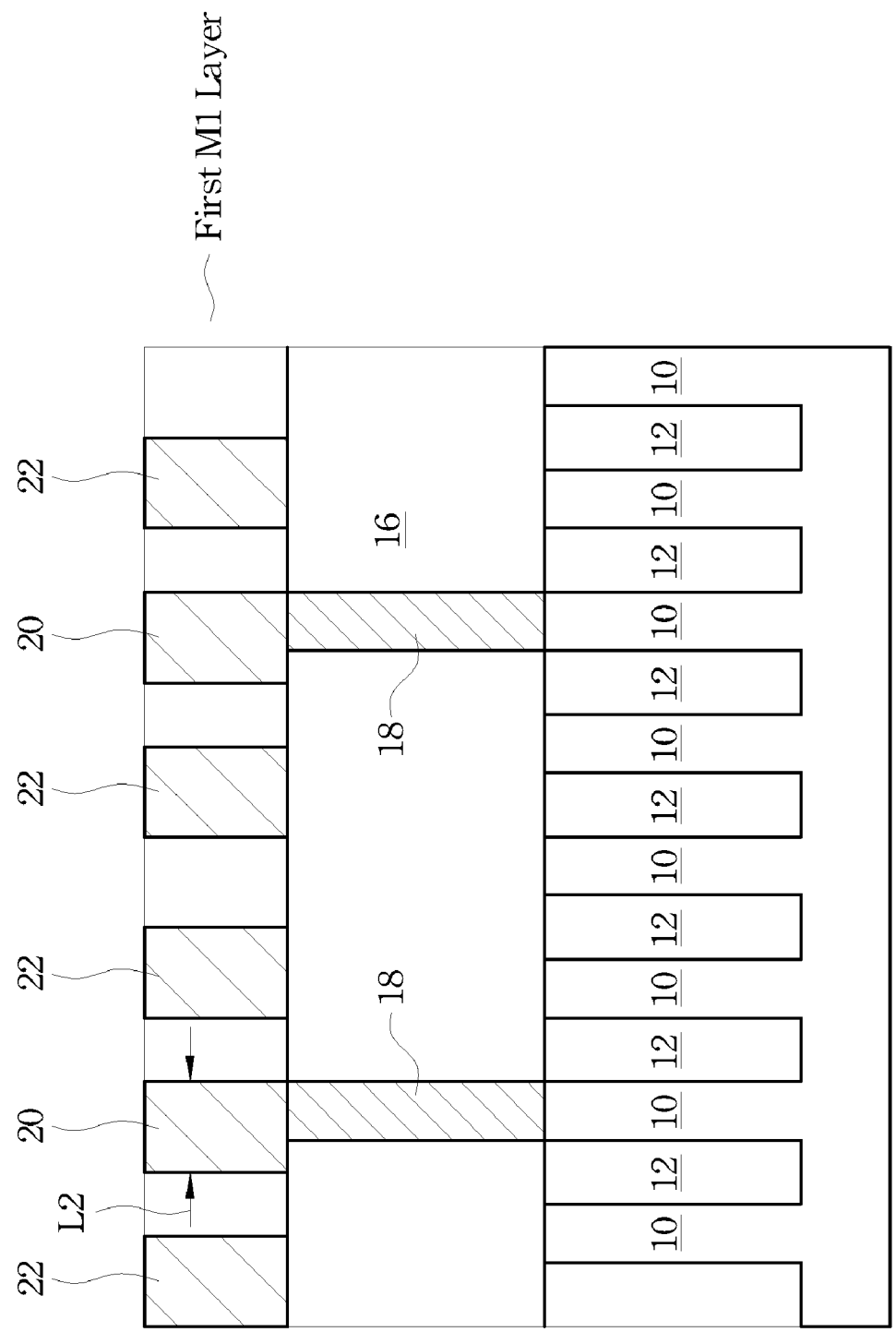

PITCH BY SPLITTING BOTTOM METALLIZATION LAYER

TECHNICAL FIELD

This invention relates generally to integrated circuits, and more particularly to the structure and formation processes of metallization layers for connecting the integrated circuits.

BACKGROUND

A conventional integrated circuit contains a plurality of metal lines separated by inter-wiring spacings, which metal lines include bus lines, bit lines, word lines, logic interconnect lines, and the like. Typically, the metal lines of vertically spaced metallization layers are electrically interconnected by vias. Metal lines formed in trench-like openings typically extend substantially parallel to the semiconductor substrate. Semiconductor devices of this type, according to current technology, may include eight or more levels of metallization layers in order to satisfy device geometries and micro miniaturization requirements.

FIGS. 1 and 2 illustrate a connection to a conventional NAND flash memory array. Referring to FIG. 1, the array includes a plurality of active regions 102 laid out parallel to each other. Active regions 102 are separated by shallow trench isolation regions 104. A plurality of word-lines 106 is formed over and perpendicular to active regions 102. Word-lines 106 also act as the gate electrodes of metal-oxide-semiconductor (MOS) devices, and thus a plurality of flash memory cells 107, which are connected in series, are formed. Select source gate 108 and select drain gate 110 are formed on opposite sides of flash memory cells 107.

FIG. 2 illustrates the formation of bit-lines 112 in the bottom metallization layer. Each of the bit-lines 112 is connected to one of active regions 102 through contacts 114. Accordingly, bit-lines 112 are vertically aligned to active regions 102, and typically have a same width W1 and a same spacing S1 as the underlying active regions 102. Assuming active regions 102 have width W1 and spacing S1. Preferably, to reduce the area occupied by the memory, width W1 and spacing S1 are both equal to the minimum feature size of the respective formation technology. For 30 nm and 40 nm technologies, the minimum feature sizes are 30 nm and 40 nm, respectively.

When the minimum feature size of integrated circuits is reduced to about 30 nm to about 40 nm, the dimensions of metal lines in metallization layers are also scaled down accordingly. However, this causes several problems. First, the mean free path of electrons is about 39 nm. When the dimensions of the copper interconnects, such as bit-lines 112, approach the mean free path of electrons, the resistivity of the interconnect structure significantly increases. Accordingly, the RC delay in the interconnect structure significantly increases. Second, when copper is filled into via openings and trench openings, copper void will become a major problem. In 30 nm and 40 nm technologies, these problems have become gating issues.

FIGS. 1 and 2 demonstrated the problem of increasing resistivity of copper lines cannot be solved by increasing the width of metal lines in conventional interconnect formation schemes. This is because the width and spacing of metal lines are limited by the dimensions of the underlying integrated circuits. Accordingly, new structures and methods for solving the above-discussed problems are needed.

SUMMARY OF THE INVENTION

In accordance with one aspect of the present invention, an integrated circuit structure includes a semiconductor substrate; a first bottom metallization (M1) layer over the semiconductor substrate; a second M1 layer over the first M1 layer, wherein metal lines in the first and the second M1 layer have widths of greater than about a minimum feature size; and vias connecting the first and the second M1 layers.

In accordance with another aspect of the present invention, an integrated circuit structure includes a memory array comprising a plurality of memory cells formed in rows and columns; a plurality of contacts connected to the memory array, wherein the plurality of contacts are arranged in a plurality of rows; a first M1 layer over the semiconductor substrate, wherein the first M1 layer comprises a first plurality of metal lines; and a second M1 layer over the first M1 layer. The second M1 layer comprises a second plurality of metal lines substantially parallel to the first plurality of metal lines. Alternating ones of the plurality of rows of contacts are connected to alternating ones of the first and the second plurality of metal lines.

In accordance with yet another aspect of the present invention, an integrated circuit structure includes a semiconductor substrate; a plurality of active region strips parallel to each other, wherein the plurality of active region strips has a first pitch; a plurality of insulation regions separating the plurality of active region strips, wherein the plurality of insulation regions has a second pitch; and a plurality of contacts over and electrically connected to the plurality of active region strips. The plurality of contacts is arranged as rows in a direction parallel to the plurality of active region strips. The rows of the plurality of contacts comprise a first plurality of contact rows and a second plurality of contact rows located in an alternating pattern. The integrated circuit structure further includes a first M1 layer comprising a first plurality of metal lines over the plurality of contacts, wherein the first plurality of metal lines are electrically connected to the first plurality of contact rows; and a second M1 layer comprising a second plurality of metal lines over the first M1 layer. The second plurality of metal lines is electrically connected to the second plurality of contact rows. The first and the second plurality of metal lines are substantially parallel to each other.

In accordance with yet another aspect of the present invention, a method of forming an integrated circuit structure includes providing a first integrated circuit layout comprising an integrated circuit; a bottom metallization layer over the integrated circuit; and a second metallization layer over the bottom metallization layer. The method further includes dividing metal lines in the bottom metallization layer into a first portion and a second portion; and generating a second integrated circuit layout. The step of generating the second integrated circuit includes laying out the integrated circuit; laying out the first portion in a first M1 layer; laying out the second portion in a second bottom metallization (M2) layer over the M1 layer; and laying out the second metallization layer over the M2 layer.

By dividing the bottom metallization layer into a first and a second M1 layer, the pitches and widths of metal lines in the first and the second metallization layers are improved. Accordingly, the resistivity of the metal lines is reduced, and RC delay is reduced.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel interconnect structure and methods of forming the same are presented. The intermediate stages of manufacturing a preferred embodiment of the present invention are illustrated. Throughout the various views and illustrative embodiments of the present invention, like reference numbers are used to designate like elements. Throughout the description, a NAND flash memory array and a corresponding overlying interconnect structure are used as examples. However, one skilled in the art will realize that the teaching of the present invention is also applicable to the formation of interconnect structures over other types of memory arrays and integrated circuits, such as dynamic random access memory (DRAM) arrays, logic circuits, input/output circuits, and the like.

Figure 1:
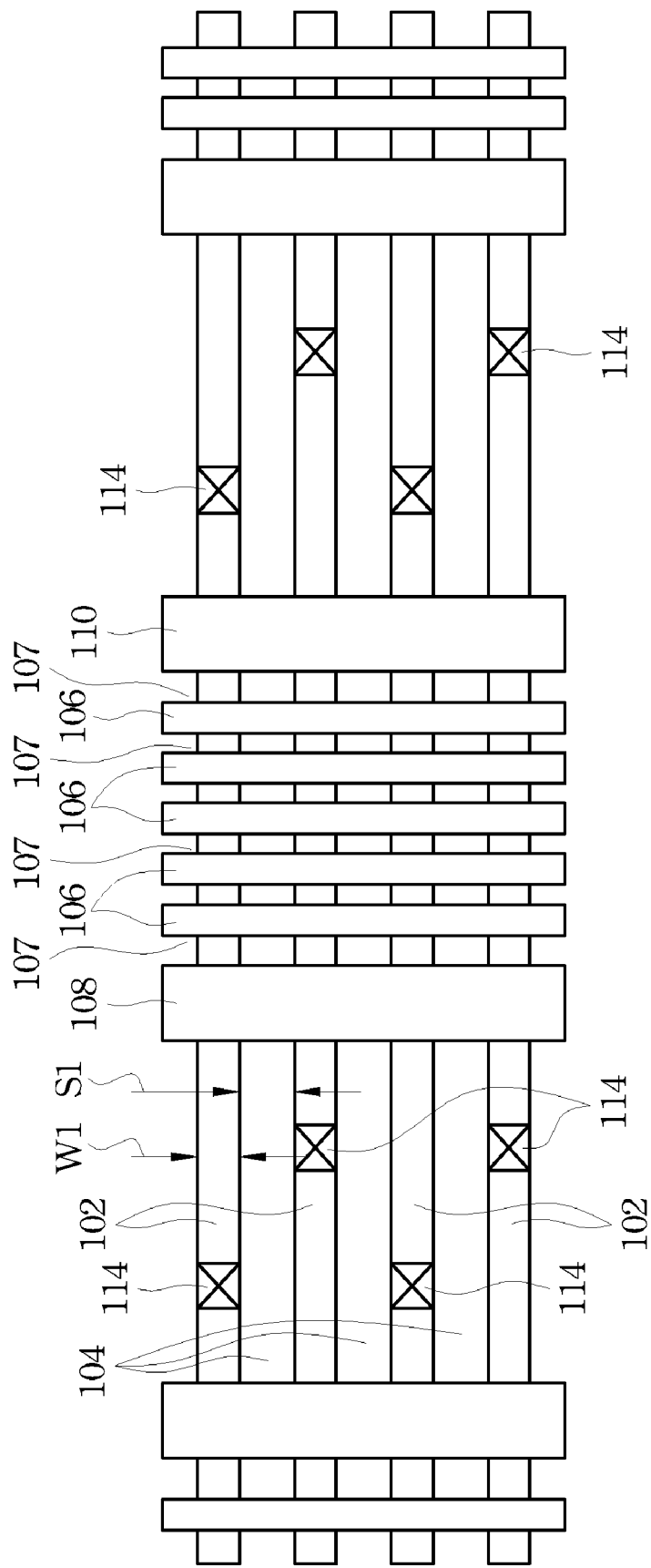
FIGS. 1 and 2 illustrate a portion of a memory array and bit-lines formed over the memory array, wherein bit-lines has a same width as the underlying active regions.
Figure 2:
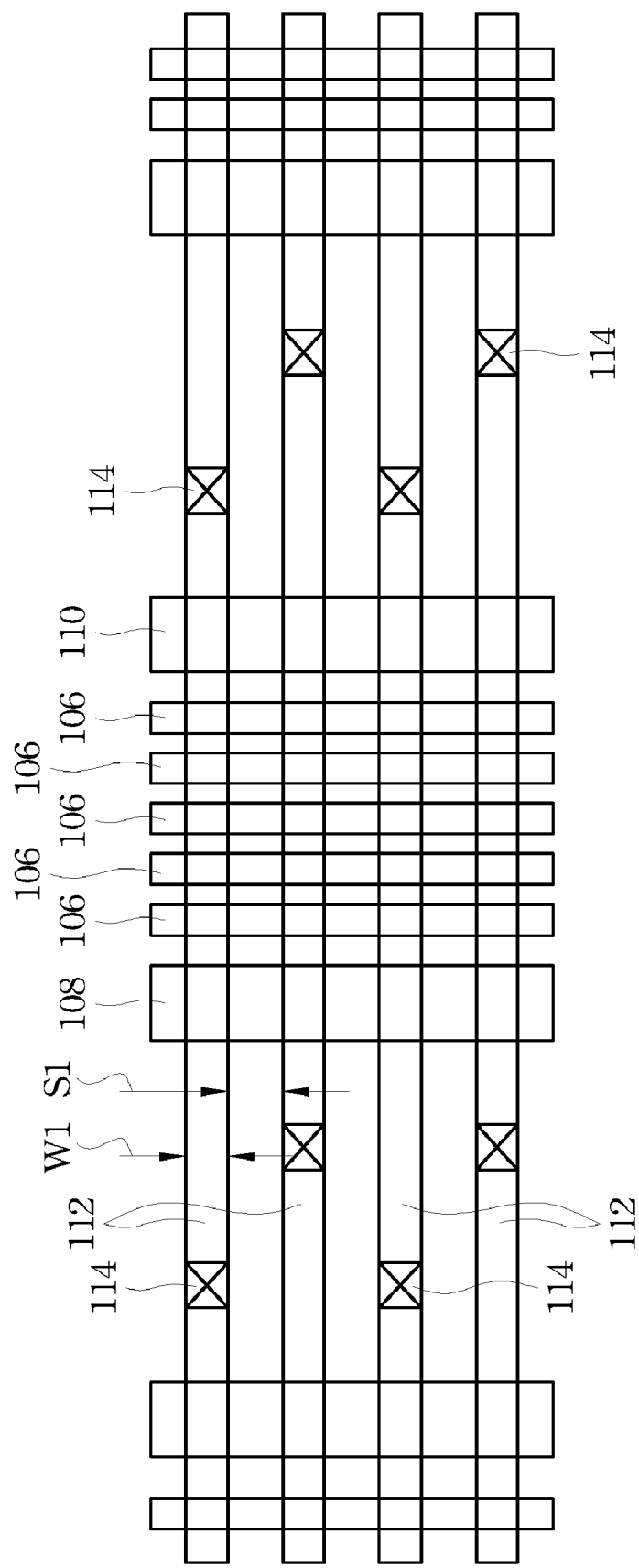
Figure 3A:
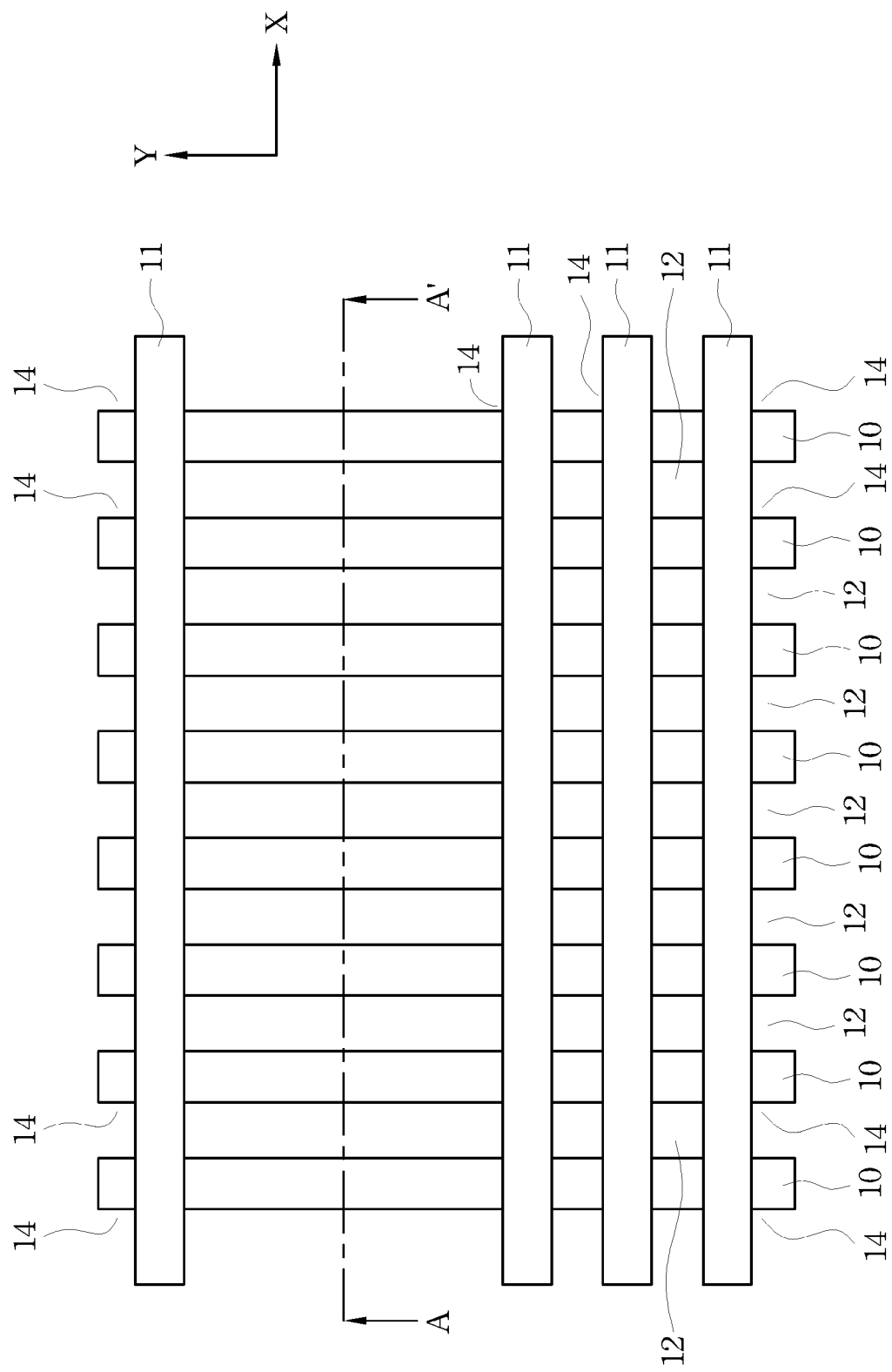
FIGS. 3A through 7 are cross-sectional views of intermediate stages in the manufacturing of an embodiment of the present invention.

FIG. 3A illustrates a top view of a portion of a semiconductor chip, which includes a plurality of active regions 10 separated by shallow trench isolation (STI) regions 12. A plurality of word-lines 11, which also act as gate electrodes, are formed in a direction perpendicular to the direction of active regions 10. Accordingly, memory cells 14 are formed. It is appreciated that the memory cells 14 formed out of a same active region 10 will be connected in series to form a long chain. Throughout the description, memory cells formed out of a same active region 10 are referred to as being in a same row. Correspondingly, the Y direction as shown in FIG. 3A is the row direction, and the X direction is the column direction. One skilled in the art, however, will realize that the concepts of "row" and "column" are interchangeable.

Figure 3B:
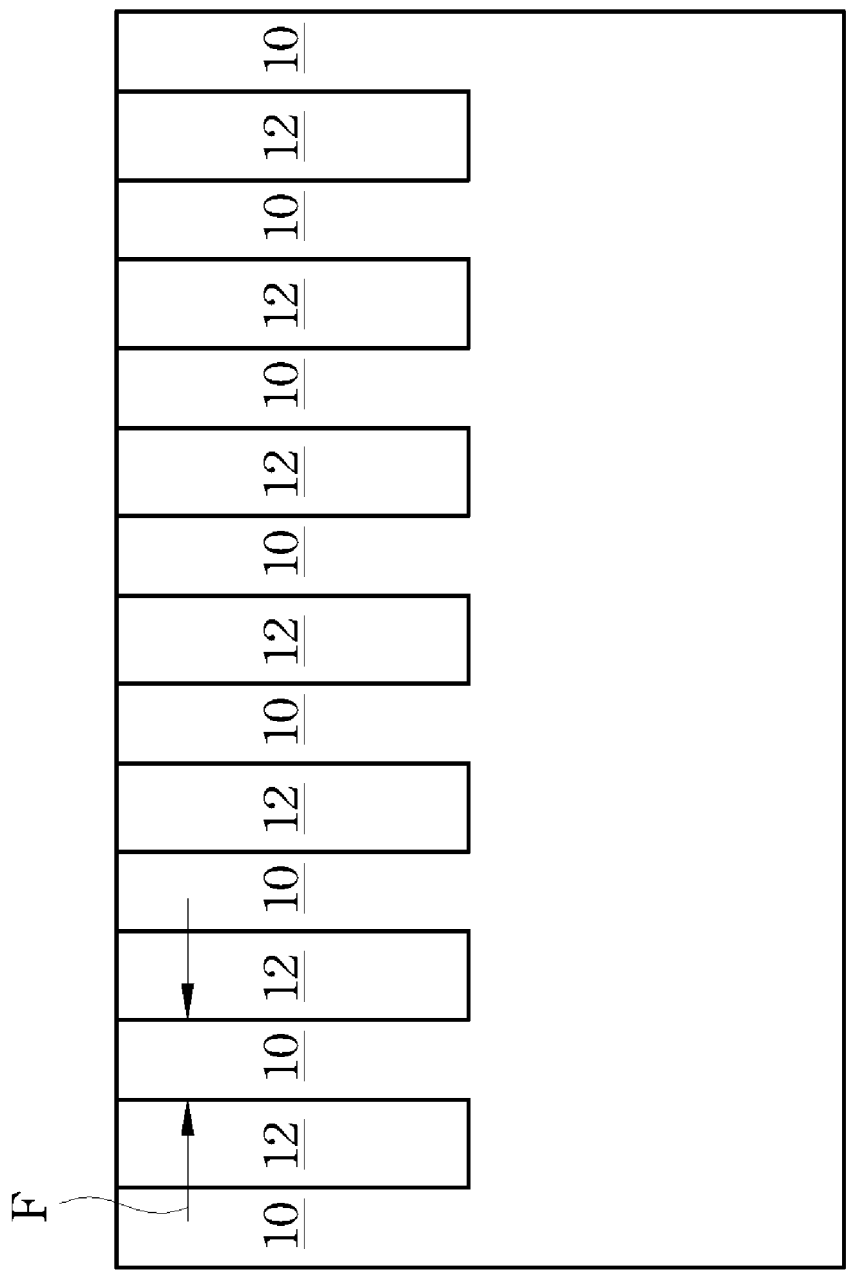

FIG. 3B illustrates a cross-sectional view of the structure shown in FIG. 3A, wherein the cross-sectional view is taken in a plane crossing line A-A'. For the convenience of discussion, it is assumed that the width of active regions 10 is F, which preferably equals to the minimum feature size of the formation technology. As is known in the art, the minimum feature size F is related to the technology used for forming the integrated circuits. For 30 nm and 40 nm technologies, the minimum feature sizes are 30 nm and 40 nm, respectively. In subsequent drawings, word-lines 11 are omitted for a clearer view.

Figure 4A:
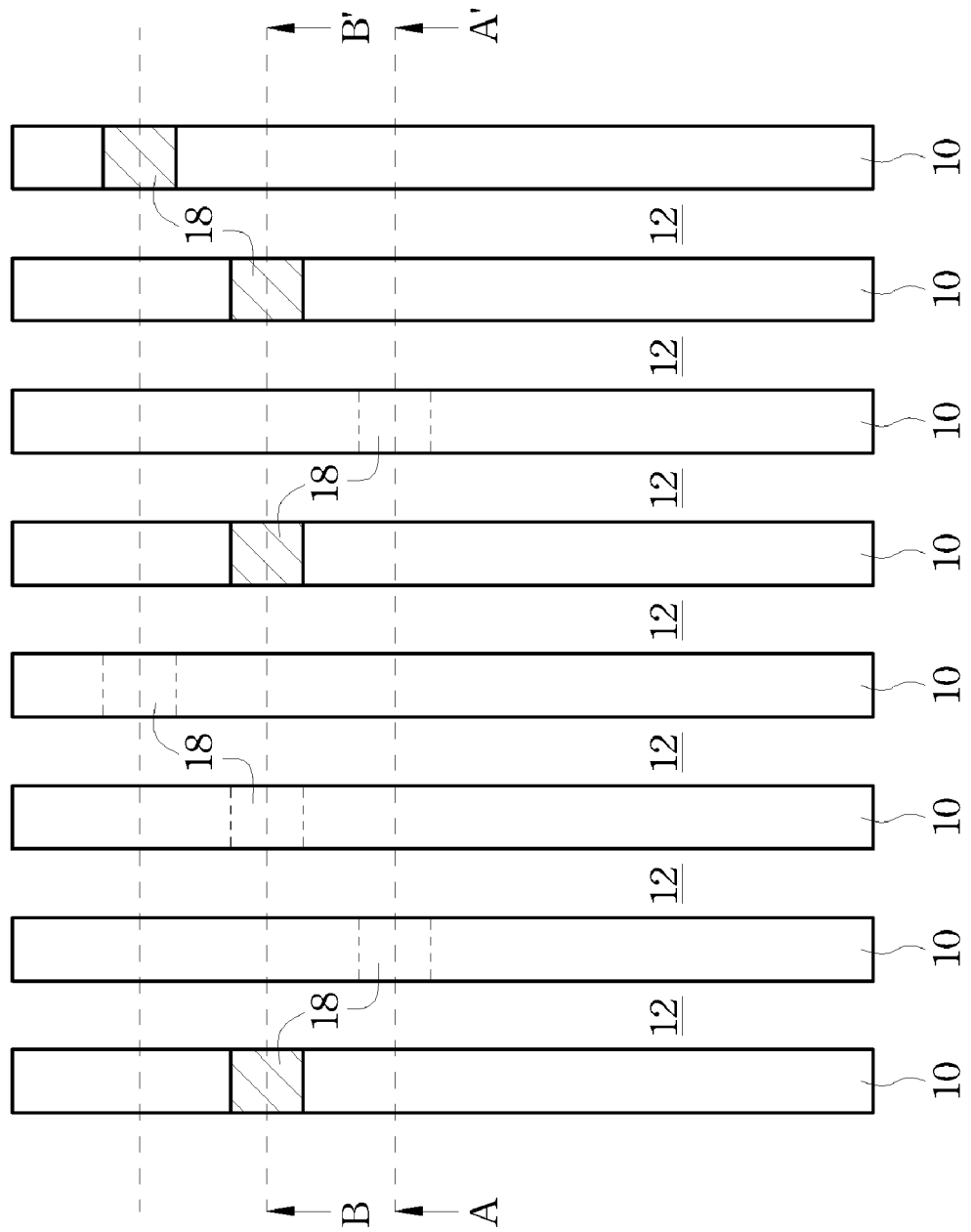
Figure 4B:
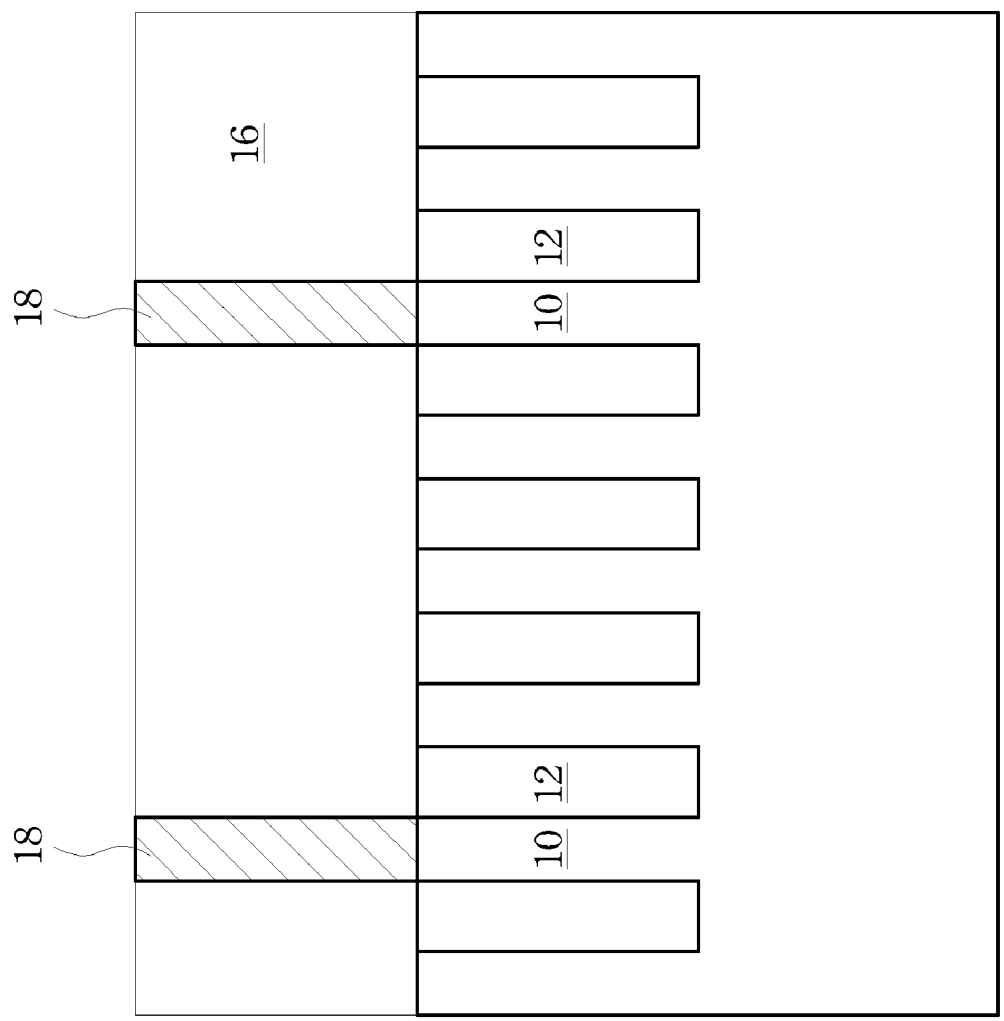
Figure 4C:
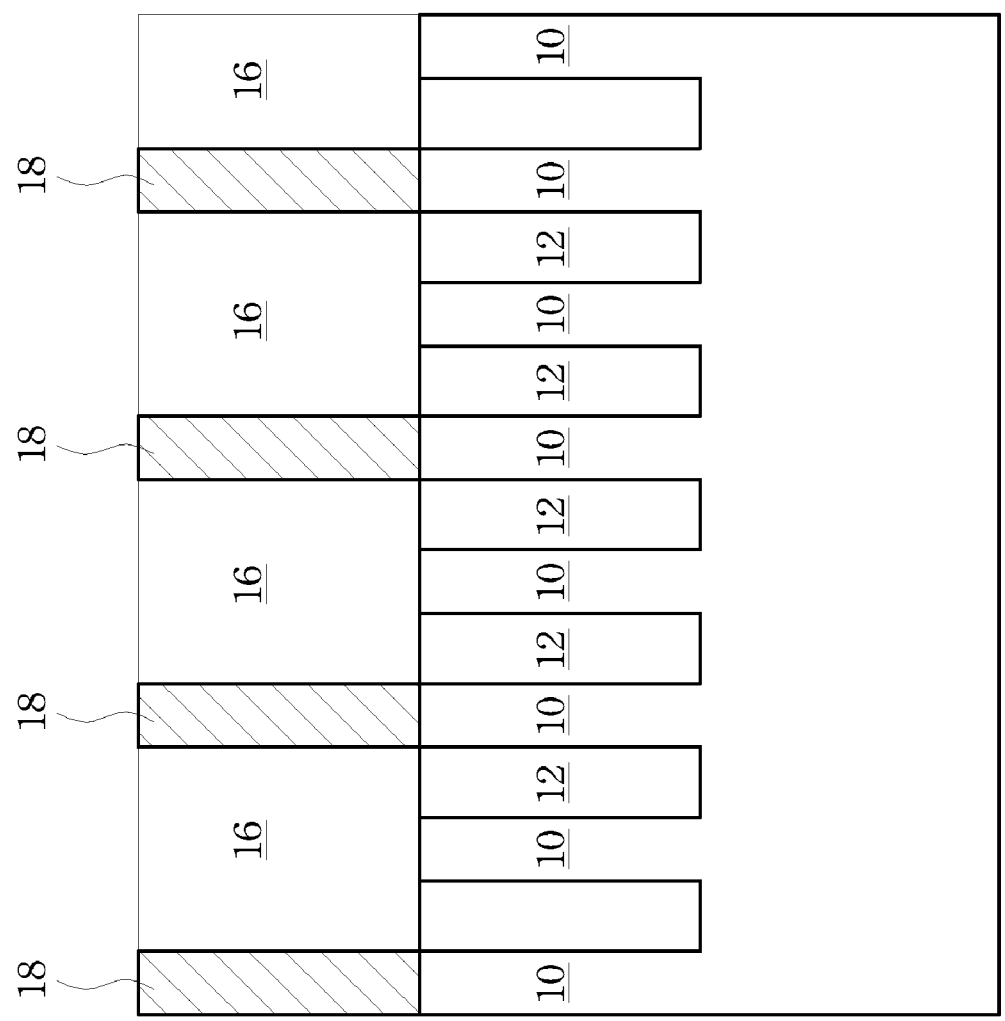

Referring to FIGS. 4B and 4C, inter-layer dielectric (ILD) 16 is formed. Contacts 18 are then formed in ILD 16. Contacts 18 are connected to the memory array, for example, active regions 10. FIG. 4A is a top view of the semiconductor structure, and FIGS. 4B and 4C are cross-sectional views of the structure shown in FIG. 4A, wherein the cross-sectional views are taken in planes crossing lines A-A' and B-B', respectively. In an embodiment, as shown in FIG. 4A, contacts 18 are staggered, so that contacts 18 connected to neighboring active regions 10 are not in a same plane. Accordingly, the distances between contacts 18 may be greater than 1 F, wherein F may be the minimum feature size. In the preferred embodiment, the distances between neighboring contacts 18 are greater than about 1.5 F.

Figure 5A:
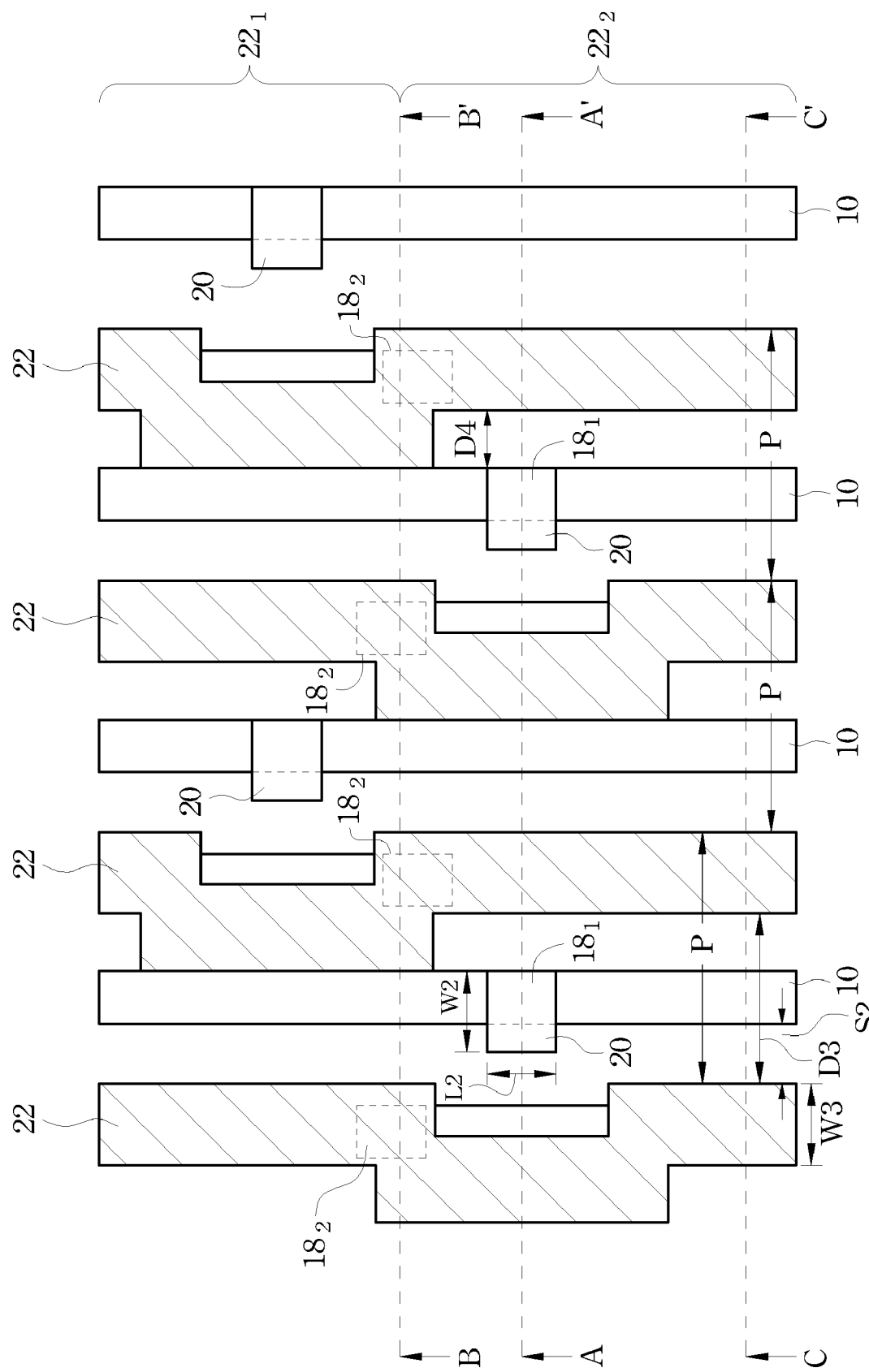
Figure 5C:
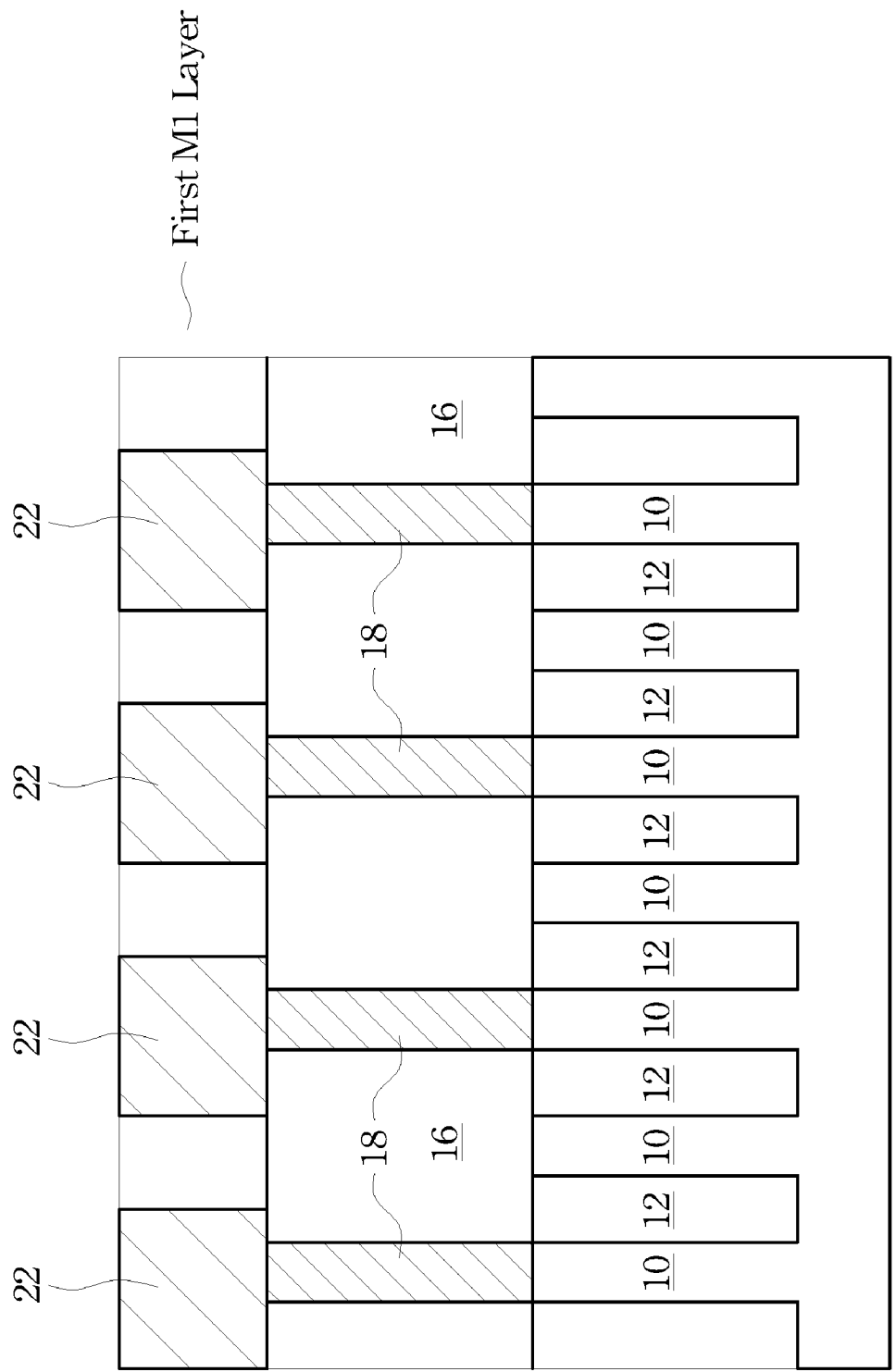
Figure 5D:
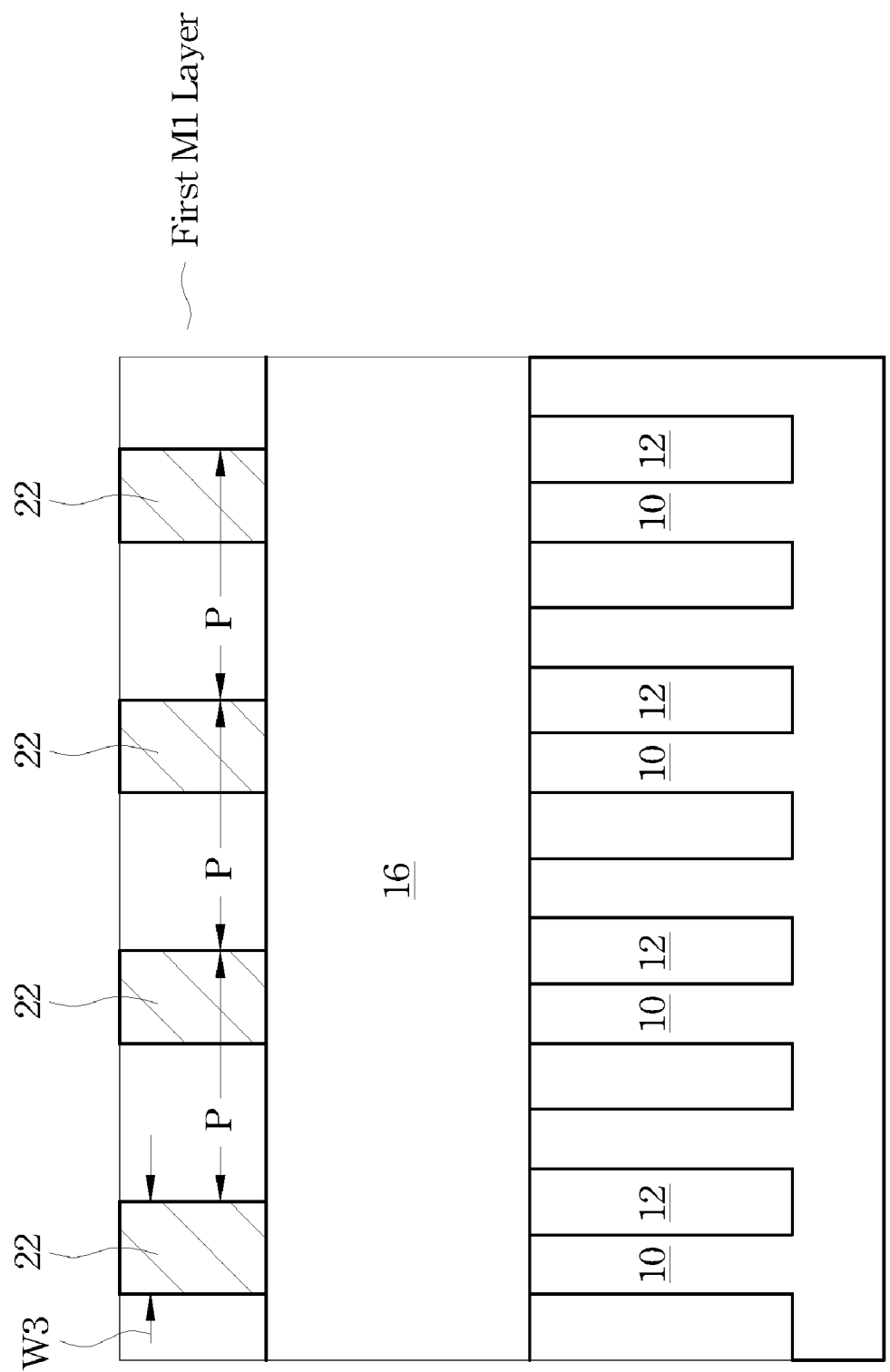

Contacts 18 connect the memory to bottom metallization layers. In the preferred embodiment, the bottom metallization (commonly referred to as M1) layer is divided into a first M1 layer, and a second M1 layer overlying the first M1 layer to upper metallization layers. The first and the second M1 layers share the duty of routing the connections from contacts 18. FIGS. 5A through 5D illustrate the formation of the first M1 layer. FIG. 5A is a top view of the semiconductor structure, and FIGS. 5B, 5C, and 5D are cross-sectional views of the structure shown in FIG. 5A, wherein the cross-sectional views are taken in planes crossing lines A-A', B-B', and C-C', respectively. Referring to FIG. 5A, contacts 18 are divided into two groups. The first group of contacts 18, which are denoted as contacts $18_1$, are connected to overlying landing pads 20 (refer to FIGS. 5A and 5B), which are then connected to the second M1 layer, as will be discussed in subsequent paragraphs. The second group of contacts 18, which are denoted as contacts $18_2$, are connected to the overlying metal lines 22. In the preferred embodiment, metal lines 22 are substantially parallel to each other, and may extend from one end (the top end in FIG. 5A, for example) of the array to the opposite end (the bottom end in FIG. 5A, for example) of the array. In an exemplary embodiment, the memory array includes NAND-flash memory cells, and thus metal lines 22 are bit-lines. Alternatively, the memory array includes other types of memory cells such as dynamic random access memory cells, flash memory cells, magnetic random access memory cells, phase change memory cells, and the like, and metal lines 22 may be bit-lines, erase gate lines, program gate lines, control gate lines, and the like.

Landing pads 20 are preferably not interconnected to other pads or metal lines in the first M1 layer. They are preferably only used as an intermediate connection for connecting contacts $18_1$ to the second M1 layer. In the preferred embodiment, each of the landing pads 20 has length L2 and width W2, which are greater than 1 F. More preferably, length L2 and width W2 are equal to or greater than about 1.5 F. Similarly, the width W3 of metal lines 22 is greater than 1 F, and more preferably greater than about 1.5 F. For 30 nm and 40 nm technologies, 1.5 F is equivalent to line widths of about 45 nm and 60 nm, respectively, which are greater than the electron mean free path of about 39 nm. Even taking the thickness of diffusion barrier layers into account, the net widths of copper lines may still be substantially equal to, or even greater than the mean free path of electrons. As a result, the resistivity of metal lines 22 is significantly reduced.

Referring to line C-C' in FIG. 5A, it is found that the nominal pitch P of metal lines 22 is 4 F, in the case width W3 of metal lines 22 is 1.5 F, the distance D3 between neighboring metal lines 22 is 2.5 F. Referring to line A-A' in FIG. 5A, the average pitch of metal lines 22 is still 4 F, however, the nearest distance D4 between neighboring metal lines 22 is only about 1.5 F. It is appreciated that the major portions of the metal lines 22 have a spacing of 2.5 F. Using the rightmost metal line 22 as an example, it contains portions $22_1$ and $22_2$.

The spacing of the portion $22_1$ to the neighboring metal line 22 is about 1.5 F, while the spacing of the portion $22_2$ to the neighboring metal line 22 is about 2.5 F. If the entire array is illustrated, metal lines 22 will extend across the array, and each of the metal lines 22 includes repeated patterns of portions $22_1$ and $22_2$. Advantageously, the total length of all portions $22_1$ is only a small percentage, for example, less than about 5 percent, of the entire length of metal lines 22. Accordingly, metal lines 22 are considered to have a "nominal" spacing of about 2.5 F, wherein the term "nominal" refers to the small percentage of the exceptions. Since the spacing between metal lines 22 in conventional interconnect structures is only 1 F, the spacing between metal lines is significantly increased, and hence the RC delay is reduced.

Figure 6A:
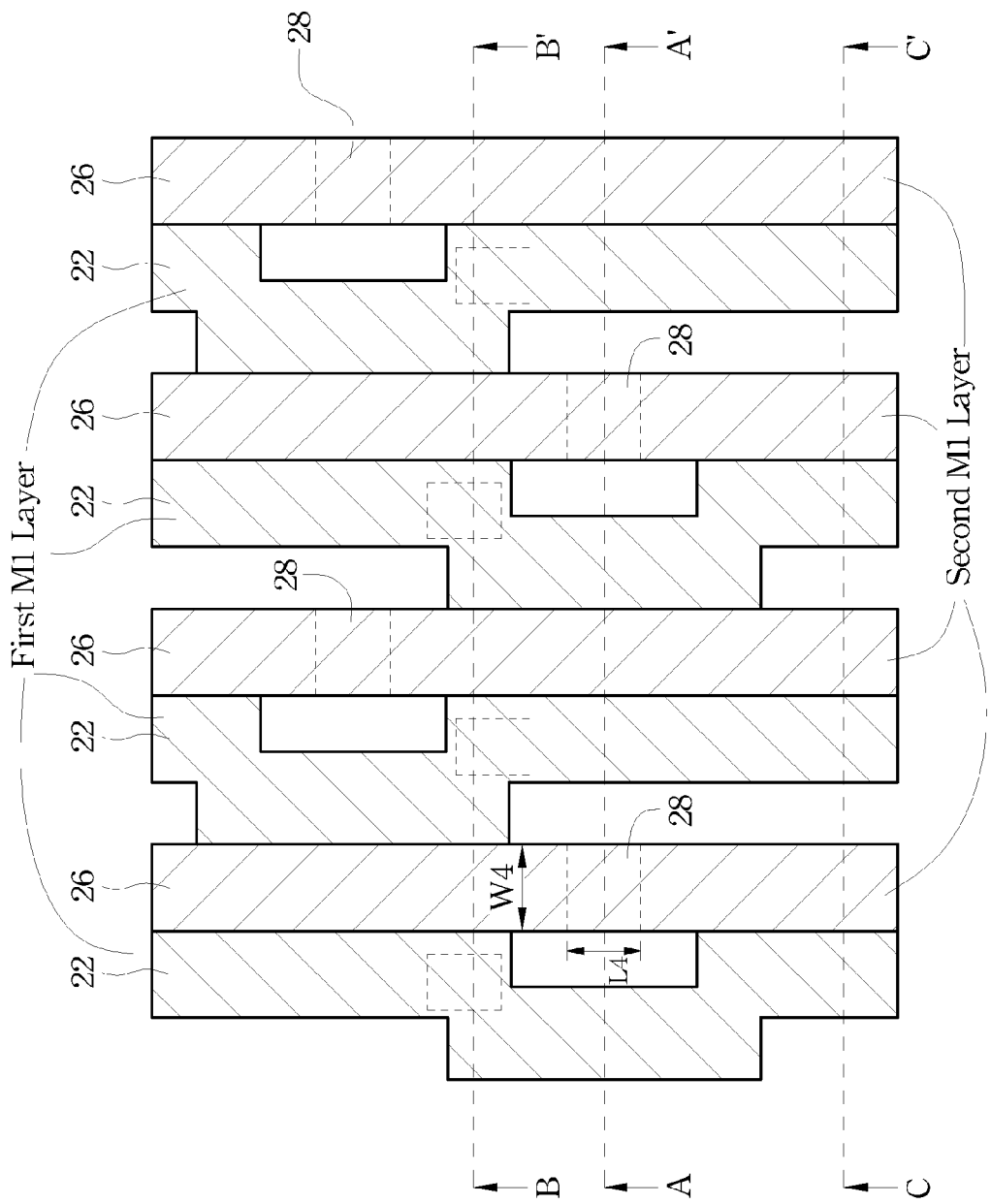
Figure 6B:
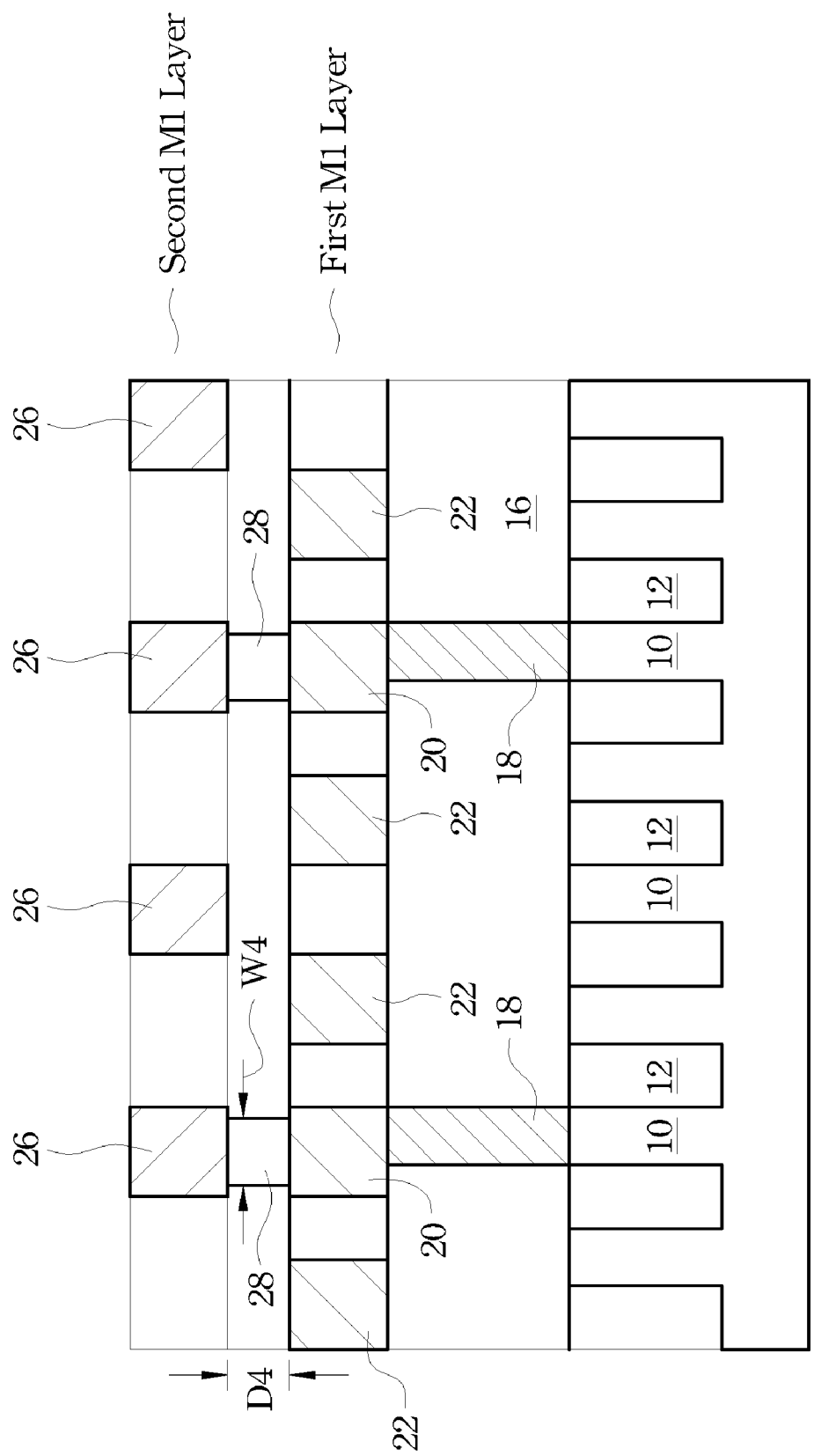
Figure 6C:
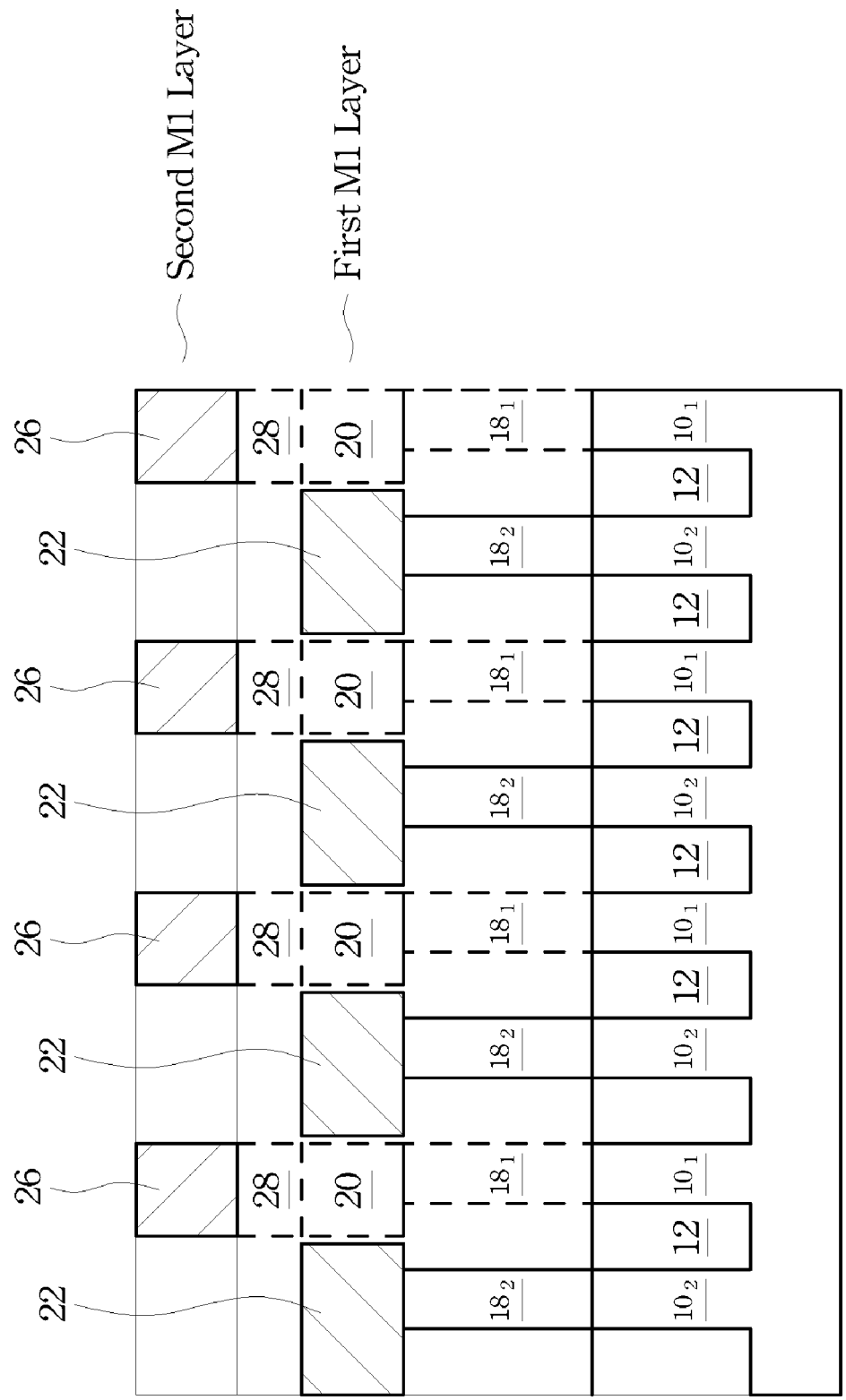
Figure 6D:
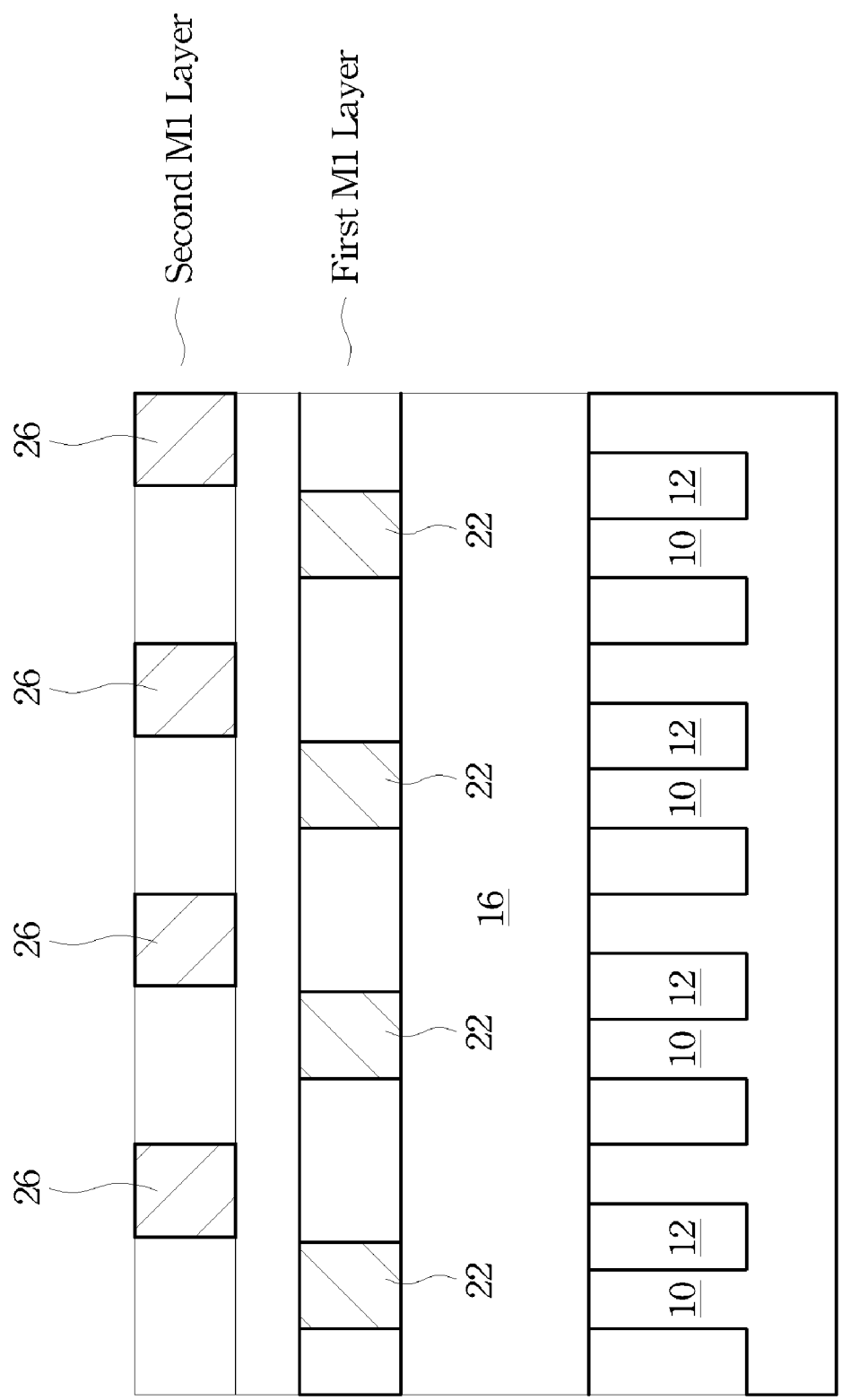

FIGS. 6A through 6D illustrate the formation of a second M1 layer over the first M1 layer. FIG. 6A is a top view of the semiconductor structure including the first and the second M1 layers, and FIGS. 6B, 6C, and 6D are cross-sectional views of the structure shown in FIG. 6A, wherein the cross-sectional views are taken in planes crossing lines A-A', B-B', and C-C', respectively. In an exemplary embodiment, the distance D4 (refer to FIG. 6D) between the first and the second M1 layers is between about 1000 Å and about 2000 Å. Preferably, the second M1 layer has substantially same specifications as the first M1 layer. For example, the thicknesses and the line widths of the first and the second M1 layers are the same. Although the second M1 layer is over the first M1 layer, it is different from the conventional second metallization (M2) layer in various aspects. First, conventional M2 layer is at least twice as wider than the first metallization layer M1, while in the embodiments of the present invention, the first and the second M1 layers have substantially the same width. Second, the functions of M1 and M2 layers are different. M1 layer is used for local interconnections, for example, for connecting to memory cells in order to operate the memory cells. The M2 layer, on the other hand, is used for global interconnections connecting different functional circuits. Throughout the description, the term "local interconnection" refers to the connection inside a functional circuit, for example a memory array, while the term "global interconnection" refers to the connection between functional circuits, for example, between a memory array and a drive circuit, or between a memory array and a logic circuit. For a memory array, the M2 layer is not used to connect to individual memory cells. Instead, the M2 layer is typically connected to M1 lines only at locations outside the memory array. Third, metal lines in M1 and M2 typically extend in perpendicular directions, while the metal lines in the first and the second M1 layers are substantially parallel. Fourth, the distance between M1 and M2 layers are significantly greater than, sometimes more than two times, the distance D4 between the first M1 and the second M1 layers. Therefore, a conventional M2 layer cannot be treated as the second M1 layer, although it is also over a M1 layer.

FIG. 6B shows that contacts 18 are connected to landing pads 20, which are in the first M1 layer, and then connected to metal lines 26 in the second M1 layer through vias 28. In the preferred embodiment, vias 28, which interconnect the first and the second M1 layers, also have length L4 (refer to FIG. 6A) and width W4 of greater than 1 F, and more preferably greater than about 1.5 F. Preferably, each of the contacts 18 will either be routed by a metal line 22 in the first M1 layer, or connected to a landing pad 20 in the first M1 layer, and then connected to a metal line 26 in the second M1 layer.

Referring to FIG. 6C, contacts 18 form a plurality of rows extending in a same direction (the direction perpendicular to the illustrated plane) as metal lines 22 and 26. Please note that dashed lines indicate that the corresponding features are not in a same plane as the features illustrated in solid lines. Correspondingly, neighboring rows of contacts 18 are preferably routed by metal lines in a different one of the first M1 layer and the second M1 layer. In other words, metal lines in the first M1 and the second M1 layers are connected to rows of contacts in an alternating pattern. For example, contacts $18_2$ and active regions $10_2$ are connected to metal lines 22 in the first M1 layer, while contacts $18_1$ and active regions $10_1$ are connected to metal lines 26 in the second M1 layer.

In the preferred embodiment, the metal lines in the first and the second M1 layers are substantially evenly distributed, which means about 50 percent of the metal lines, which are connected to the memory array, are in the first M1 layer, and about 50 percent of the metal lines are in the second M1 layer, although designers may distribute the metal lines in different ratios.

Figure 7:
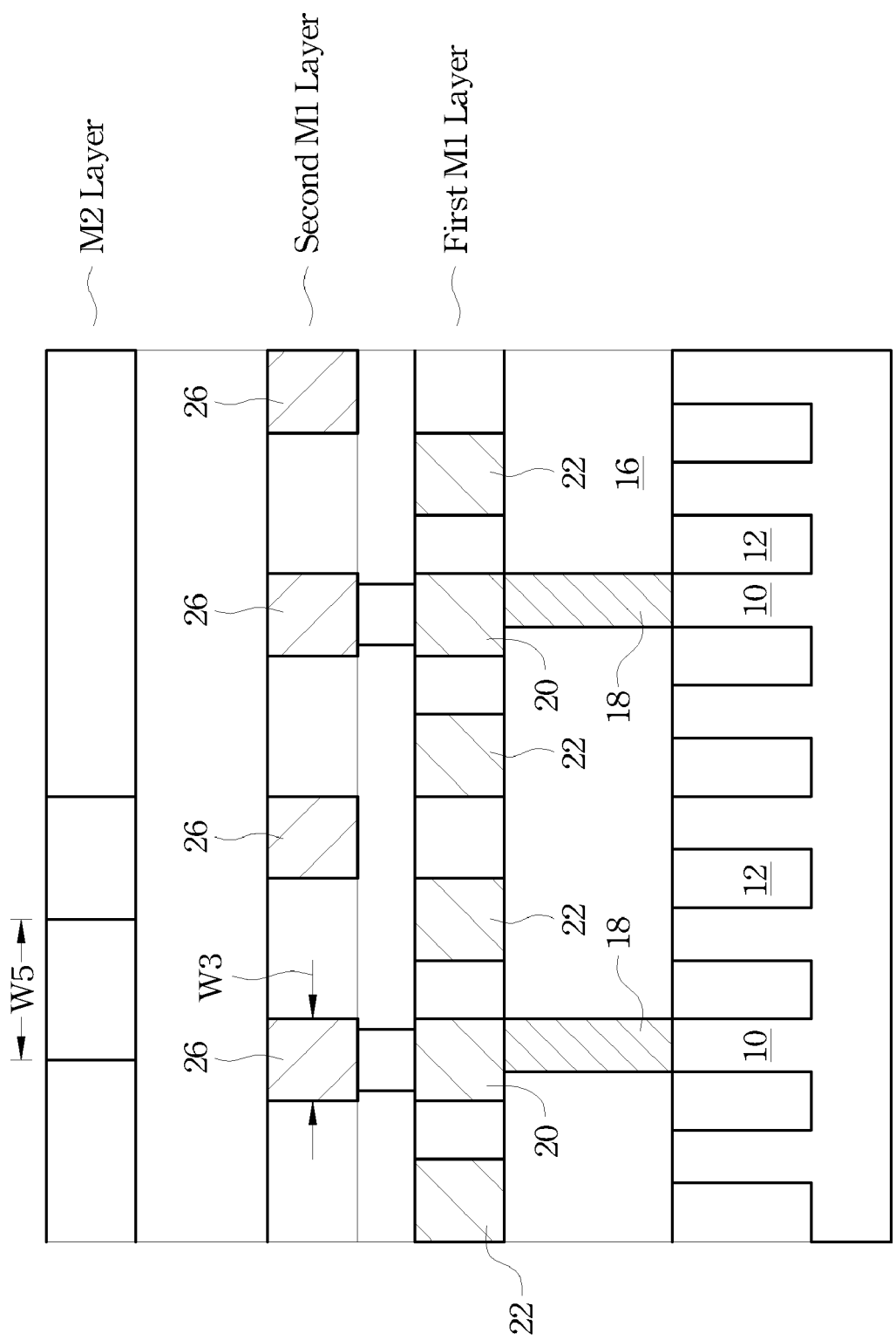

FIG. 7 illustrates the formation of second metallization layer M2 over the second M1 layer. Preferably, metal lines in the M2 layer have a greater width W5 than width W3 of the metal lines 22 in the first M1 layer, wherein the ratio of W5 to W3 is preferably greater than about two.

The embodiments of the present invention are good candidates for being used in NAND-flash memory arrays for the reasons that bit-lines of the NAND-flash memory arrays are tightly located. However, in other types of memory arrays, such as DRAM arrays, contacts will still be laid out by rows and columns, and the rows of contacts can still be connected to the first and the second M1 layers in an alternating pattern. It is noted, however, that neighboring rows of contacts may be connected to different types of components in memory cells.

In addition, the concept of the present invention can be applied to other integrated circuits such as logic circuits. An exemplary usage of the present invention is in the shrinking of conventional circuits into smaller scales. In this case, after the shrinking, if the width and/or spacing of metal lines are smaller than the desirable values, the bottom metallization layer M1 may be divided into two portions, each being laid out in one of the first and the second M1 layers.

Due to the reason that about a half of the metal lines are routed in each of the first and the second M1 layers, the pitch of the metal lines increases from 2 F to 4 F. Accordingly, the line width and spacing increase. Advantageously, the widths of metal lines can be increased over the mean free path of electrons. In the preferred embodiments of the present invention, the increase in the line widths does not require the relaxation of design rules, and hence no chip area penalty results.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit structure comprising:
   a memory array comprising memory cells formed in rows and columns;
   contacts connected to the memory array;
   a first bottom metallization (M1) layer over the semiconductor substrate, wherein the first M1 layer comprises first metal lines, each of the first metal lines having a plurality of first contacts; and
   a second M1 layer over the first M1 layer, wherein the second M1 layer comprises second metal lines substantially parallel to the first metal lines, each of the first metal lines having a plurality of second contacts, and
   wherein the first metal lines and the second metal lines alternate in a plan view, and
   wherein the second contacts electrically coupled to the second metal lines that are adjacent to a selected one of the second metal lines are not in a plane that is orthogonal to the second metal lines and that intersects any of the second contacts in the selected one of the second metal lines.

2. The integrated circuit structure of claim 1, wherein rows of the memory cells have a first pitch, and wherein the first and the second metal lines each has a second pitch of at least twice the first pitch.

3. The integrated circuit structure of claim 2, wherein the first pitch is equal to a minimum feature size.

4. The integrated circuit structure of claim 3, wherein the second pitch is about four times the minimum feature size.

5. The integrated circuit structure of claim 2, wherein the first and the second metal lines have widths of greater than about 1.5 times the first pitch.

6. The integrated circuit structure of claim 2, wherein the second metal lines are connected to landing pads in the first M1 layer through vias, and wherein the vias and the landing pads have lengths and widths greater than about 1.5 times the first pitch.

7. An integrated circuit structure comprising:
   a semiconductor substrate;
   active region strips parallel to each other, wherein the active region strips have a first pitch;
   insulation regions separating the active region strips, wherein the insulation regions have a second pitch;
   contacts over and electrically connected to the active region strips, wherein the contacts are arranged as contact rows in a direction parallel to the active region strips, and wherein the contact rows comprise first contact rows and second contact rows located in an alternating pattern, and wherein individual contacts in the second contact rows are staggered from contacts in adjacent second contact rows;
   a first M1 layer comprising first metal lines over the contacts, wherein the first metal lines are electrically connected to the first contact rows; and
   a second M1 layer comprising second metal lines over the first M1 layer, wherein the second metal lines are electrically connected to the second contact rows, and wherein the first and the second metal lines are substantially parallel to each other.

8. The integrated circuit structure of claim 7, wherein the second pitch equals to the first pitch.

9. The integrated circuit structure of claim 7, wherein each of the first and the second metal lines has an average pitch equal to a sum of the first and the second pitches.

10. The integrated circuit structure of claim 7, wherein the active region strips and the insulation regions each have widths equal to a minimum feature size, and wherein the first and the second metal lines have line widths of greater than the minimum feature size.

11. The integrated circuit structure of claim 10, wherein the first and the second metal lines have a pitch equal to four times the minimum feature size.

12. The integrated circuit structure of claim 10, wherein the line widths are greater than about 1.5 times of the minimum feature size.

13. An integrated circuit structure comprising:
    a semiconductor substrate;
    a first bottom metallization (M1) layer over the semiconductor substrate, wherein the first M1 layer comprises first metal lines and rows of landing pads, wherein the rows of landing pads are substantially parallel to the first metal lines, wherein the rows of landing pads and the first metal lines are formed in an alternating pattern, wherein the first metal lines comprise a first pitch and a second pitch between adjacent first metal lines, wherein the first pitch is four times a minimum feature size, wherein the second pitch is greater than the first pitch, wherein a width of each of the landing pads and the first metal lines is greater than the minimum feature size, and wherein spacing between each of the landing pads and neighboring first metal lines at the second pitch is at least a minimum feature size; and
    a second M1 layer over the first M1 layer, wherein the second M1 layer comprises second metal lines connected to the landing pads.

14. The integrated circuit structure of claim 13, wherein the minimum feature size comprises a width of an active area of a semiconductor device disposed in the semiconductor substrate.

15. The integrated circuit structure of claim 13, wherein each of the first and second metal lines comprises at least a metal line selected from the group consisting essentially of a word-line, a bit-line, an erase gate line, a program gate line, a control gate line, and combinations thereof.

16. The integrated circuit structure of claim 13 further comprising a second metallization (M2) layer over the second M1 layer, wherein the first and second metal lines have a substantially same width, and wherein metal lines in the M2 layer have a greater width than the first and second metal lines.

17. The integrated circuit structure of claim 13 further comprising contacts arranged in rows, wherein neighboring rows are connected to different ones of the first metal lines and the rows of landing pads.

18. The integrated circuit structure of claim 17 further comprising a memory array comprising memory cells arranged in rows and columns, wherein the contacts are connected to bit-lines of the memory array.

19. The integrated circuit structure of claim 18, wherein active regions of the memory cells have a pitch of two times the minimum feature size.

20. The integrated circuit structure of claim 13, wherein the width of each of the first metal lines is greater than about 1.5 times the minimum feature size.

* * * * *